(12) United States Patent
Chang et al.

(10) Patent No.: US 7,236,056 B2
(45) Date of Patent: Jun. 26, 2007

(54) DIRECT CURRENT OFFSET CANCELING CIRCUIT OF TRANS-IMPEDANCE AMPLIFIER AND AUTOMATIC GAIN CONTROL TRANS-IMPEDANCE AMPLIFIER THEREOF

(75) Inventors: Chien-Fu Chang, Hsinchu (TW); Li-Ren Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 153 days.

(21) Appl. No.: 11/232,860

(22) Filed: Sep. 23, 2005

(65) Prior Publication Data

US 2006/0290432 A1    Dec. 28, 2006

(30) Foreign Application Priority Data

Jun. 22, 2005    (TW) .............................. 94120818 A

(51) Int. Cl.
*H03F 3/08*    (2006.01)
(52) U.S. Cl. .................... 330/308; 330/9; 250/214 AG
(58) Field of Classification Search ................ 330/308, 330/270; 327/307
See application file for complete search history.

(56) References Cited

U.S. PATENT DOCUMENTS 6,084,232 A * 7/2000 Kimura .................. 250/214 A
6,342,694 B1 * 1/2002 Satoh ..................... 250/214 A
6,552,605 B1 * 4/2003 Yoon ............................. 330/9
6,774,728 B2    8/2004 Seetharaman et al.
6,833,762 B2    12/2004 Seetharaman et al.

* cited by examiner

*Primary Examiner*—Robert Pascal
*Assistant Examiner*—Alan Wong
(74) *Attorney, Agent, or Firm*—Harness, Dickey & Pierce, P.L.C.

(57) ABSTRACT

A direct current (DC) offset canceling circuit of a trans-impedance amplifier and an automatic gain control trans-impedance amplifier is provided, including: a trans-impedance amplifier for receiving an input current and converting the input current into a first voltage signal, while the trans-impedance amplifier is provided with a plurality of inverters connected in series, wherein a sample node is defined between each inverter; a DC detector for retrieving and comparing the signals at any sample node, thereby generating a trigger signal according to the comparison; a DC eliminator for providing a path to the DC component of the input current in response to the triggering by the signal trigger, to eliminate the DC component; a reference voltage unit for outputting a reference voltage value; and a voltage output amplifier for comparing the reference voltage and the first voltage signal, to amplify the output of a second voltage signal.

20 Claims, 12 Drawing Sheets

DIRECT CURRENT OFFSET CANCELING CIRCUIT OF TRANS-IMPEDANCE AMPLIFIER AND AUTOMATIC GAIN CONTROL TRANS-IMPEDANCE AMPLIFIER THEREOF

This Non-provisional application claims priority under 35 U.S.C. § 119(a) on Patent Application No(s). 094120818 filed in Taiwan on Jun. 22, 2005, the entire contents of which are hereby incorporated by reference.

BACKGROUND OF THE INVENTION

1. Field of Invention

The present invention relates to a direct current offset canceling circuit, particularly to a direct current offset canceling circuit of trans-impedance amplifier (TIA) and an automatic gain control trans-impedance amplifier thereof.

2. Related Art

The main function of a trans-impedance amplifier is to convert a photocurrent signal into a voltage signal and amplify it, and the input photocurrent signal includes a direct current (DC) component and an alternating current (AC) component, wherein the DC component part will influence the operation of the trans-impedance amplifier, therefore, it is necessary to design a circuit for canceling the DC component such that the trans-impedance amplifier can be operated normally. The circuit architecture of a general trans-impedance amplifier is shown in FIG. 1, which includes a trans-impedance amplifier 10, a reference voltage unit 40 and a voltage output amplifier 50. The trans-impedance amplifier 10 further includes an operational amplifier 10a and a resistor 10b, wherein the both ends of the resistor 10b are connected respectively to the input and output of the operational amplifier 10a. And the reference voltage unit 40 further includes an operational amplifier 40a and a resistor 40b, wherein the both ends of the resistor 40b are connected respectively to the input and output of the operational amplifier 40a. When the input photocurrent signal includes a DC component, the DC component part will influence the operation of the trans-impedance amplifier 10.

In recent trans-impedance amplifier direct current offset canceling circuit techniques, the related arts of U.S. Pat. No. 6,774,728 and No. 6,833,762 disclose respectively a trans-impedance amplifier DC offset canceling circuit and a trans-impedance amplifier DC offset canceling circuit having an automatic gain control, which mainly for retrieving signals in the input and output of the trans-impedance amplifier to obtain its DC offset amount and eliminate it correspondingly, to solve the problem of the DC component influence to the trans-impedance amplifier operation.

Therefore, one of the tasks to be addressed by the researchers is how to provide a DC offset canceling circuit of trans-impedance amplifier.

SUMMARY OF THE INVENTION

In regard to the above problem, the main object of the present invention is to provide a DC offset canceling circuit of trans-impedance amplifier, for stabilizing the operation of the trans-impedance amplifier through canceling the DC component of the input current.

Therefore, in order to realize the above object, a DC offset canceling circuit of trans-impedance amplifier disclosed in the present invention is used for filtering the DC component of the input current, which includes a trans-impedance amplifier, a DC detector, a DC eliminator, a reference voltage unit and a voltage amplifier.

The trans-impedance amplifier has an input end and an output end, wherein the input end is used for receiving an input current, and converting the input current into a first voltage signal to be output by the output end. The trans-impedance amplifier further includes a plurality of (for example, three) inverters connected in series, wherein a sample node is defined between each inverter and at the input and output ends of the trans-impedance amplifier respectively, and the width ratio of PMOS and NMOS of each inverter is the same; and a resistor having one end connected to the input end of the trans-impedance amplifier, and the other end connected to the output end of the trans-impedance amplifier.

The DC detector has two input ends and a single output end, for retrieving and comparing the signals at any sample node, thereby generating a trigger signal. And a low pass filter is further connected in series between each of the input ends and each of the sample nodes, wherein the low pass filter may also be replaced by a resistor, and a capacitor is connected to the ground at the output end thereof.

The DC eliminator is connected to the input end of the trans-impedance amplifier, and triggered by a trigger signal, for providing a path to the DC component of the input current, to eliminate the DC component of the input current.

The reference voltage unit for outputting a reference voltage value is composed of a trans-impedance amplifier circuit architecture, which includes an inverter and a resistor, wherein the width ratio of PMOS and NMOS of the inverter is the same as the width ratio of PMOS and NMOS of each inverter in the trans-impedance amplifier.

The voltage output amplifier is used for comparing the reference voltage to the first voltage signal, to amplify the output of a second voltage signal.

In order to realize the above object, the automatic gain control trans-impedance amplifier disclosed in the present invention includes a trans-impedance amplifier, a DC detector, a DC eliminator, a reference voltage unit, a voltage amplifier and a gain controller.

The trans-impedance amplifier has an input end and an output end, wherein the input end is used for receiving an input current, and converting the input current into a first voltage signal to be output by the output end. The trans-impedance amplifier includes a plurality of (for example, three) inverters connected in series, wherein a sample node is defined between each inverter and at the input and output ends of the trans-impedance amplifier respectively, and the width ratio of PMOS and NMOS in each inverter is the same; and a resistor having one end connected to the input end, and the other end connected to the output end.

The DC detector has two input ends and a single output end, for retrieving and comparing the signals at any sample node, thereby generating a trigger signal. And a low pass filter is further connected in series between each of the input ends and each of the sample nodes, wherein the low pass filter may also be replaced by a resistor, and a capacitor is connected to the ground at the output end thereof.

The DC eliminator is connected to the input end of the trans-impedance amplifier, for providing a path to the DC component of the input current in response to the triggering by the trigger signal, to eliminate the DC component.

The reference voltage unit for outputting a reference voltage value is composed of a trans-impedance amplifier circuit architecture, which includes an inverter and a resistor, wherein the width ratio of PMOS and NMOS of the inverter is the same as the width ratio of PMOS and NMOS of each inverter in the trans-impedance amplifier.

The voltage output amplifier is used for comparing the reference voltage to the first voltage signal, to amplify the output of a second voltage signal.

The gain controller is connected in parallel to a first inverter in the trans-impedance amplifier, for receiving a feedback trigger signal to control the gain of the trans-impedance amplifier.

With such DC offset canceling circuit of trans-impedance amplifier and the automatic gain control trans-impedance amplifier, the DC offset amount is obtained more precisely through the property of inverter in the trans-impedance amplifier, to eliminate the DC component in the input current, while the automatic gain control mechanism can control the output of the trans-impedance amplifier more efficiently, to prevent the influence to the next circuit operation when the input signal is excessively large.

The features and practices of the present invention will be described in details with reference to the figures by way of the most preferable embodiment.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only for, and thus are not limitative of the present invention, and wherein.

DETAILED DESCRIPTION OF THE INVENTION

Figure 1:
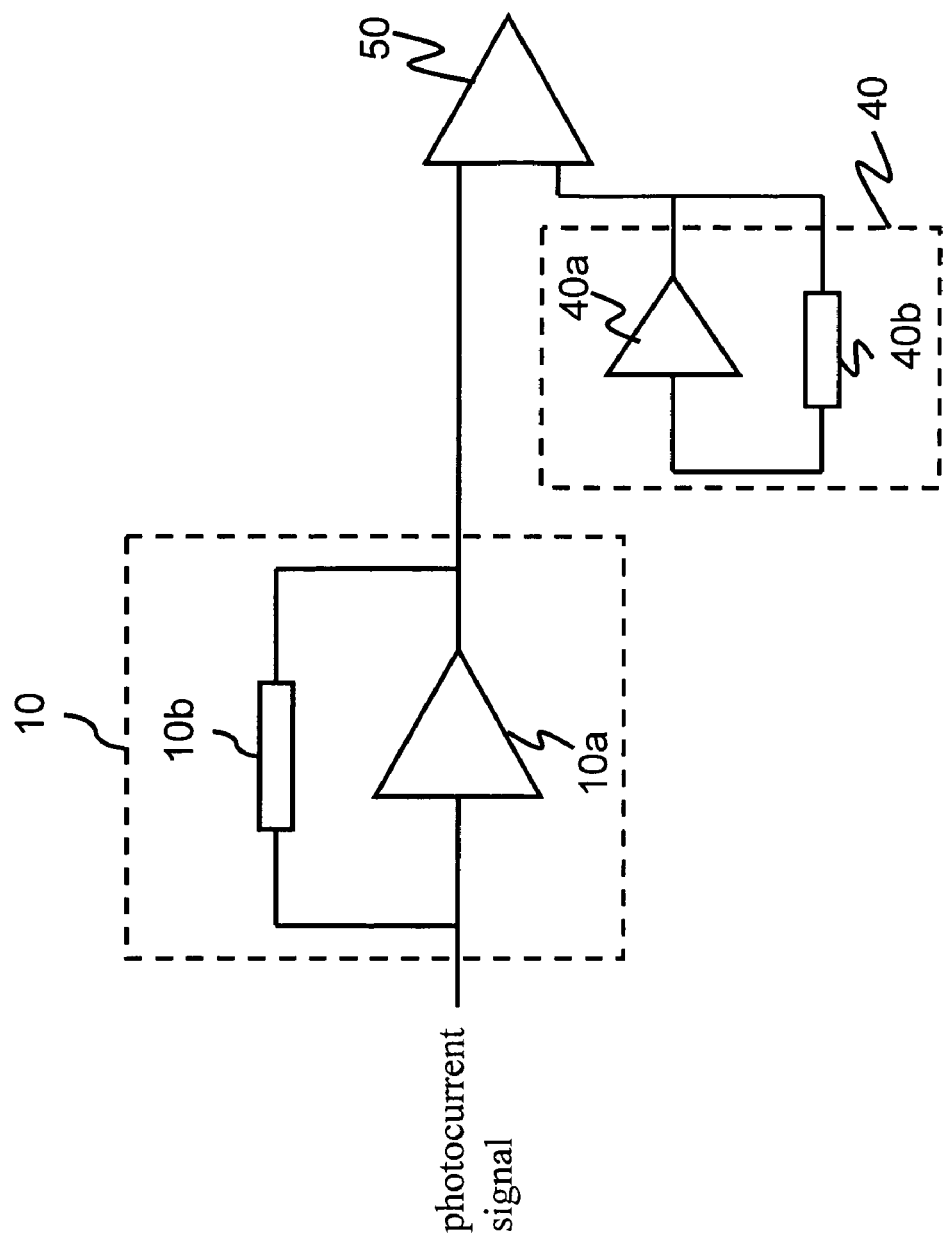
FIG. 1 is a circuit block diagram of the related art.
Figure 2A:
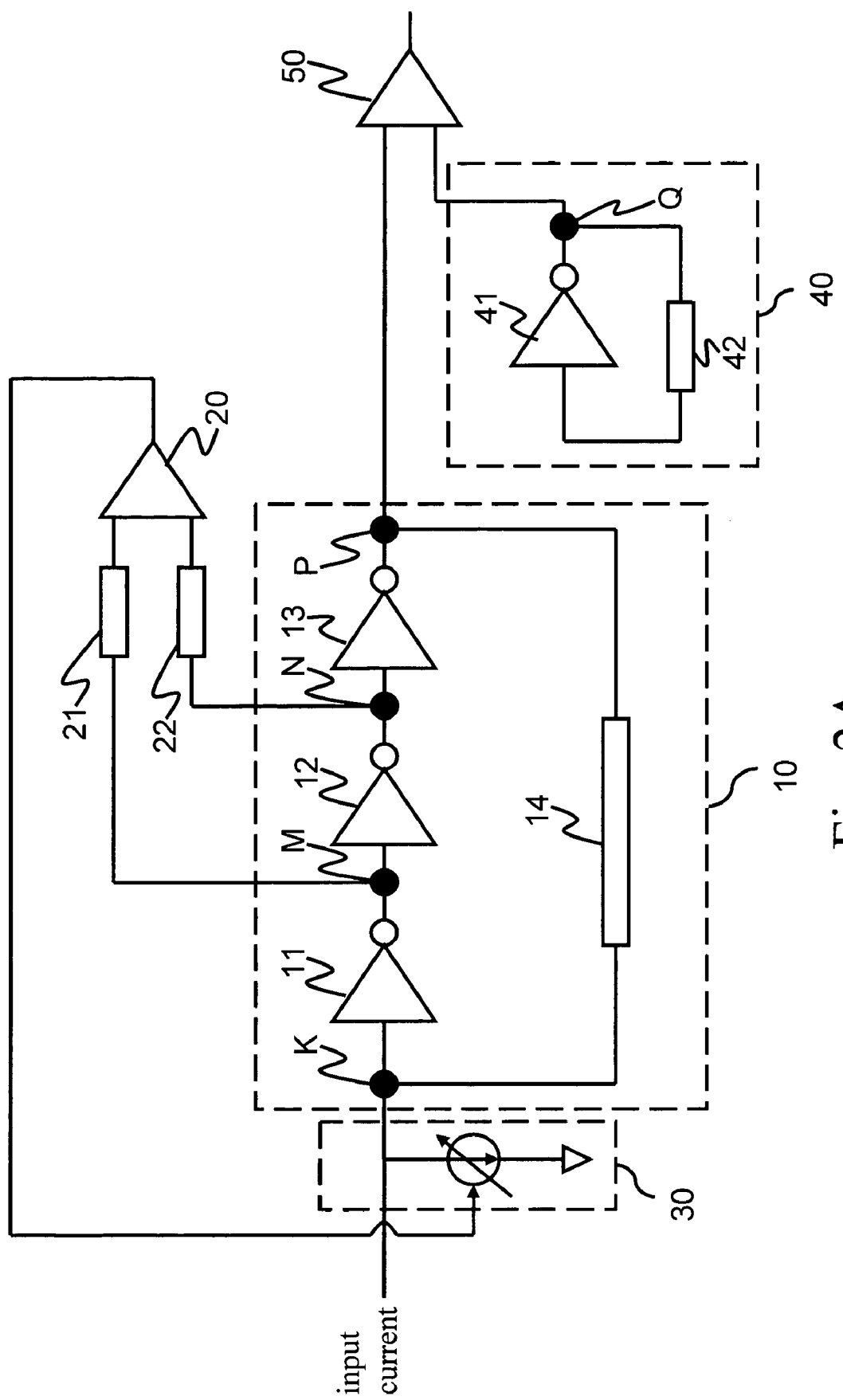
FIG. 2A is a circuit block diagram of a first embodiment of the present invention.

Referring to FIG. 2A, a circuit block diagram of a first embodiment of the present invention is shown, which includes a trans-impedance amplifier 10, a DC detector 20, a DC eliminator 30, a reference voltage unit 40 and a voltage amplifier 50.

The trans-impedance amplifier 10 has an input end and an output end, wherein the input end is used for receiving an input current, and converting the input current into a first voltage signal to be output by the output end. The trans-impedance amplifier 10 further includes a first inverter 11, a second inverter 12, a third inverter 13 and a resistor 14. Each said inverter is connected respectively in series, and a sample node (i.e. sample node K, M, N and P) is defined between each inverter and at the input and output ends of the trans-impedance amplifier 10. And the resistor 14 has one end connected to the input end of the trans-impedance amplifier 10, and the other end connected to the output end of the trans-impedance amplifier 10. The said inverters can be composed of PMOS and NMOS transistors, and the width ratio of PMOS and NMOS of each inverter is the same.

The DC detector 20 has a first input end and a second input end connected respectively to the sample node M and the sample node N, for retrieving and comparing signals at the sample node M and the sample node N, thereby generating a trigger signal, and output it to the DC eliminator 30 through the output end. A low pass filter 21 is connected in series between the first input end and the sample node M, and a low pass filter 22 is connected in series between the second input end and the sample node N. The said DC detector 20 can be composed of a comparison operational amplifier.

The DC eliminator 30 is connected to the input end of the trans-impedance amplifier 10, and triggered by the trigger signal, for providing a path to the DC component of the input current, to eliminate the DC component of the input current, wherein the DC eliminator 30 can be composed of a variable current source.

The reference voltage unit 40 used for outputting a reference voltage value is composed of a trans-impedance amplifier circuit architecture, which includes a forth inverter 41 and a resistor 42. A sample node Q is defined at the output end of the forth inverter 41, and both ends of the resistor 42 are connected respectively to the input end and the output end of the forth inverter 41, wherein the width ratio of PMOS and NMOS of the forth inverter 41 is the same as the width ratio of PMOS and NMOS of the first inverter 11, the second inverter 12 and the third inverter 13 in the trans-impedance amplifier 10.

The voltage output amplifier 50 has a first input end connected to the sample node Q and a second input end connected to the sample node P, for comparing the signals of the reference voltage and the first voltage, to amplify the output of a second voltage signal, wherein the voltage output amplifier 50 can be composed of a comparison operational amplifier.

The circuit operating principles will be described below. First, when there is no input signal, the DC levels of the sample nodes M, N, P in the trans-impedance amplifier 10 and the sample node Q in the reference voltage unit 40 are the same; and when there is an input signal, the DC levels of the sample nodes M, N and P start to change, and the DC offset amount in the input signal is obtained through comparing the sample nodes M and N. Next, the DC detector 20 outputs the DC offset amount and feeds back it to the DC eliminator 30, to provide a path to the DC component of the input signal, and thereby to eliminate the DC component of the input signal.

Furthermore, the sample nodes can be collocated randomly, but the two sample nodes at the input and output ends of the trans-impedance amplifier 10 (i.e. sample node K and sample node P) will not be taken at the same time; and when the sample node is Q, the output end of the trans-impedance amplifier 10 (i.e. sample node P) will not be taken.

Figure 2B:
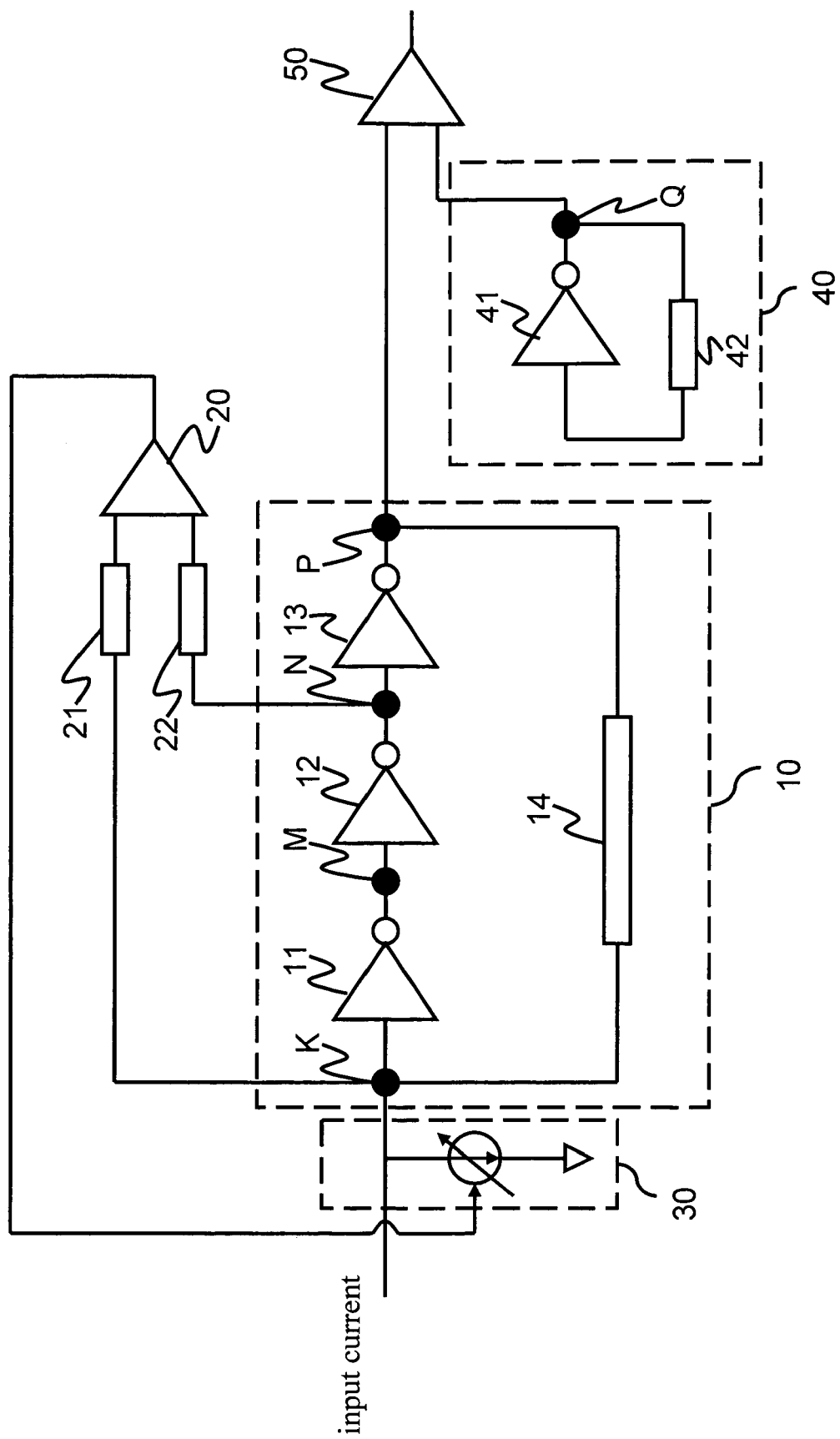
FIG. 2B is a circuit block diagram of a second embodiment of the present invention.

Referring to FIG. 2B, a circuit block diagram of a second embodiment of the present invention is shown, which is different from the first embodiment in that the sample nodes are different. The sample nodes retrieved by the second embodiment are sample nodes K and N, and the circuit operating principle are as described above and will not be repeated herein.

Figure 2C:
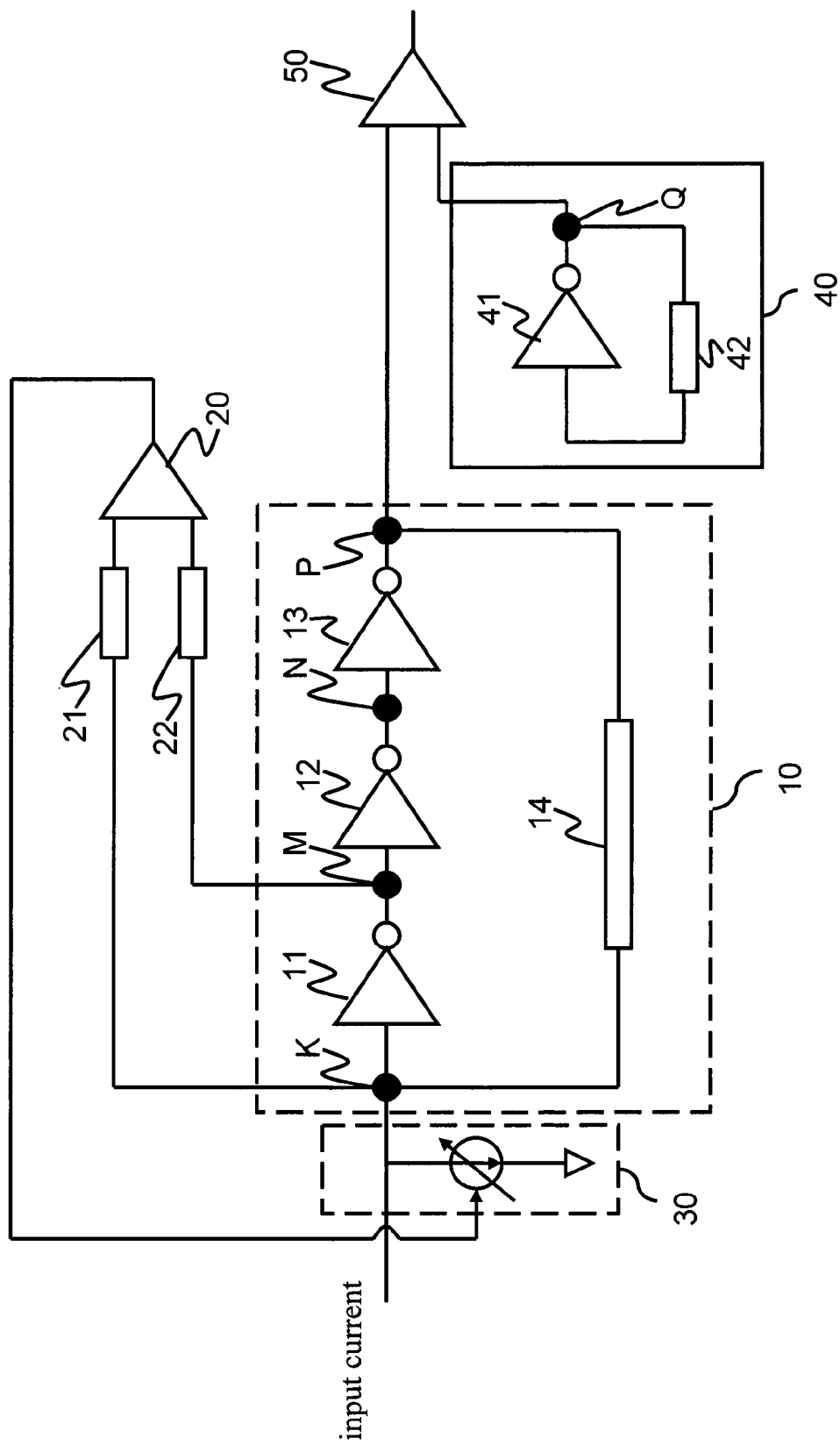
FIG. 2C is a circuit block diagram of a third embodiment of the present invention.

Referring to FIG. 2C, a circuit block diagram of a third embodiment of the present invention is shown, which is different from the first embodiment in that the sample nodes are different. The sample nodes retrieved by the third embodiment are sample nodes K and M, and the circuit operating principle are as described above and will not be repeated herein.

Figure 2D:
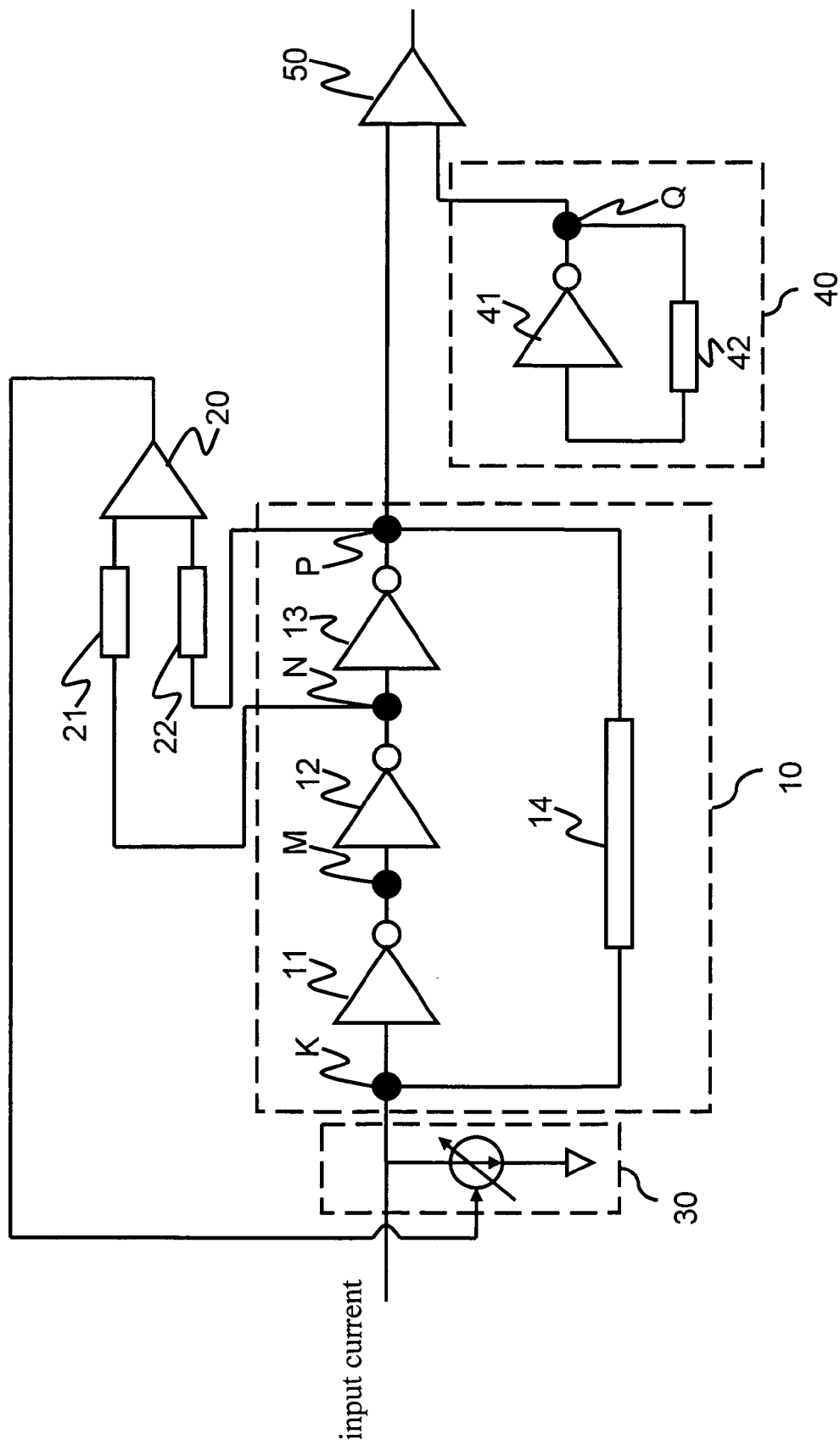
FIG. 2D is a circuit block diagram of a forth embodiment of the present invention.

Referring to FIG. 2D, a circuit block diagram of a forth embodiment of the present invention is shown, which is different from the first embodiment in that the sample nodes are different. The sample nodes retrieved by the forth embodiment are sample nodes N and P, and the circuit operating principle are as described above and will not be repeated herein.

Figure 2E:
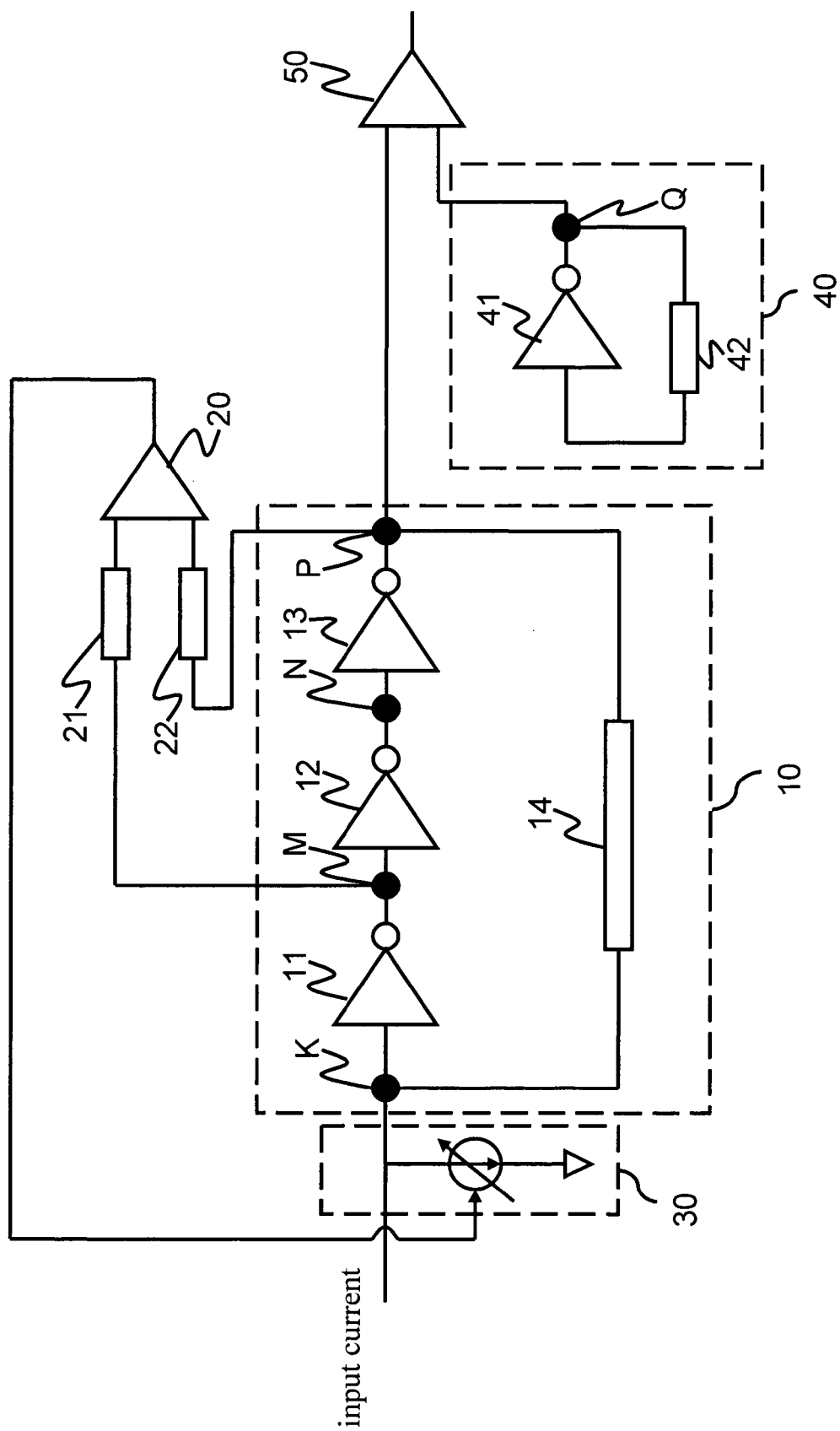
FIG. 2E is a circuit block diagram of a fifth embodiment of the present invention.

Referring to FIG. 2E, a circuit block diagram of a fifth embodiment of the present invention is shown, which is different from the first embodiment in that the sample nodes are different. The sample nodes retrieved by the fifth embodiment are sample nodes M and P, and the circuit operating principle are as described above and will not be repeated herein.

Figure 2F:
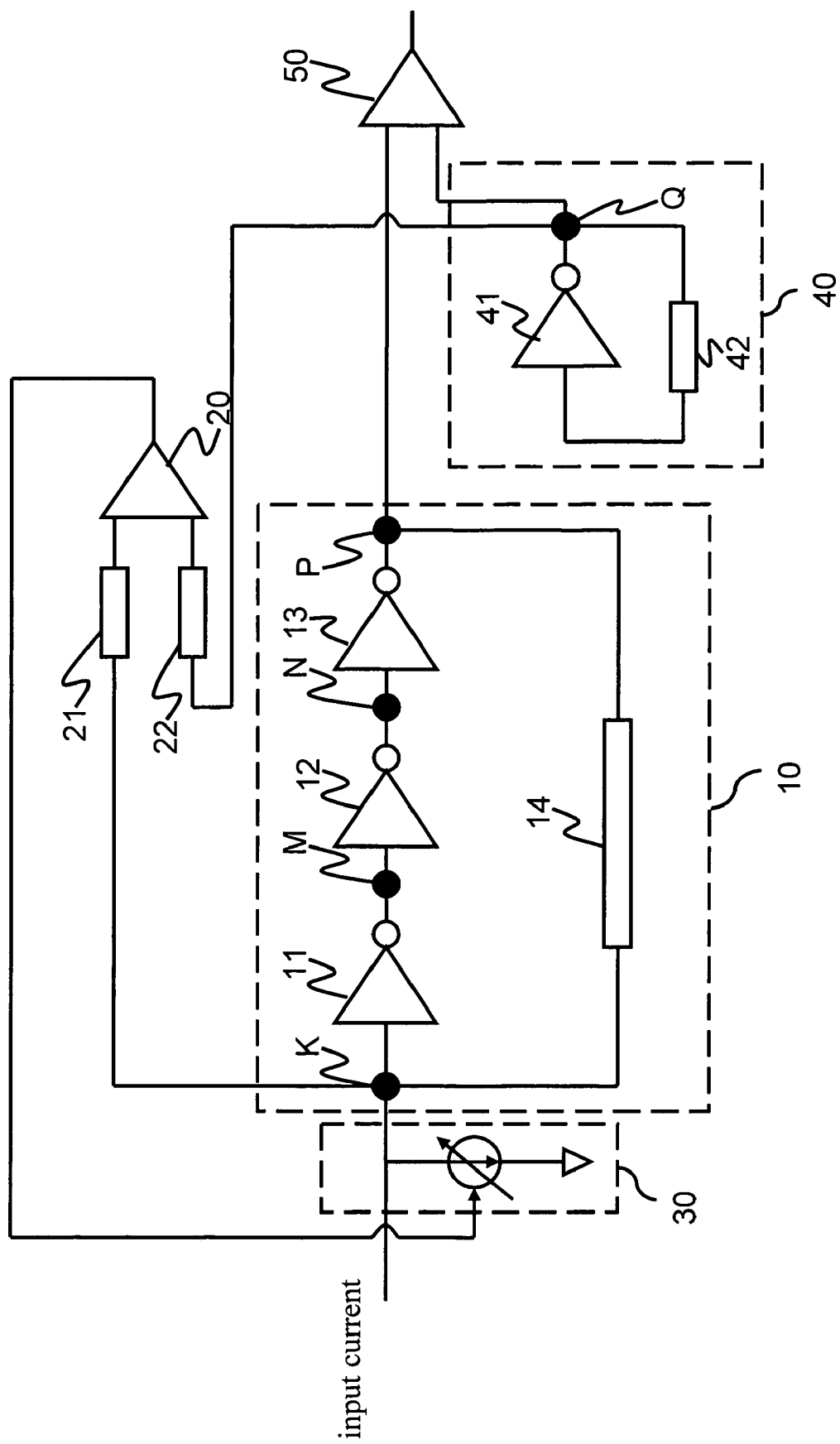
FIG. 2F is a circuit block diagram of a sixth embodiment of the present invention.

Referring to FIG. 2F, a circuit block diagram of a sixth embodiment of the present invention is shown, which is different from the first embodiment in that the sample nodes are different. The sample nodes retrieved by the sixth embodiment are sample nodes K and Q, and the circuit operating principle are as described above and will not be repeated herein.

Figure 2G:
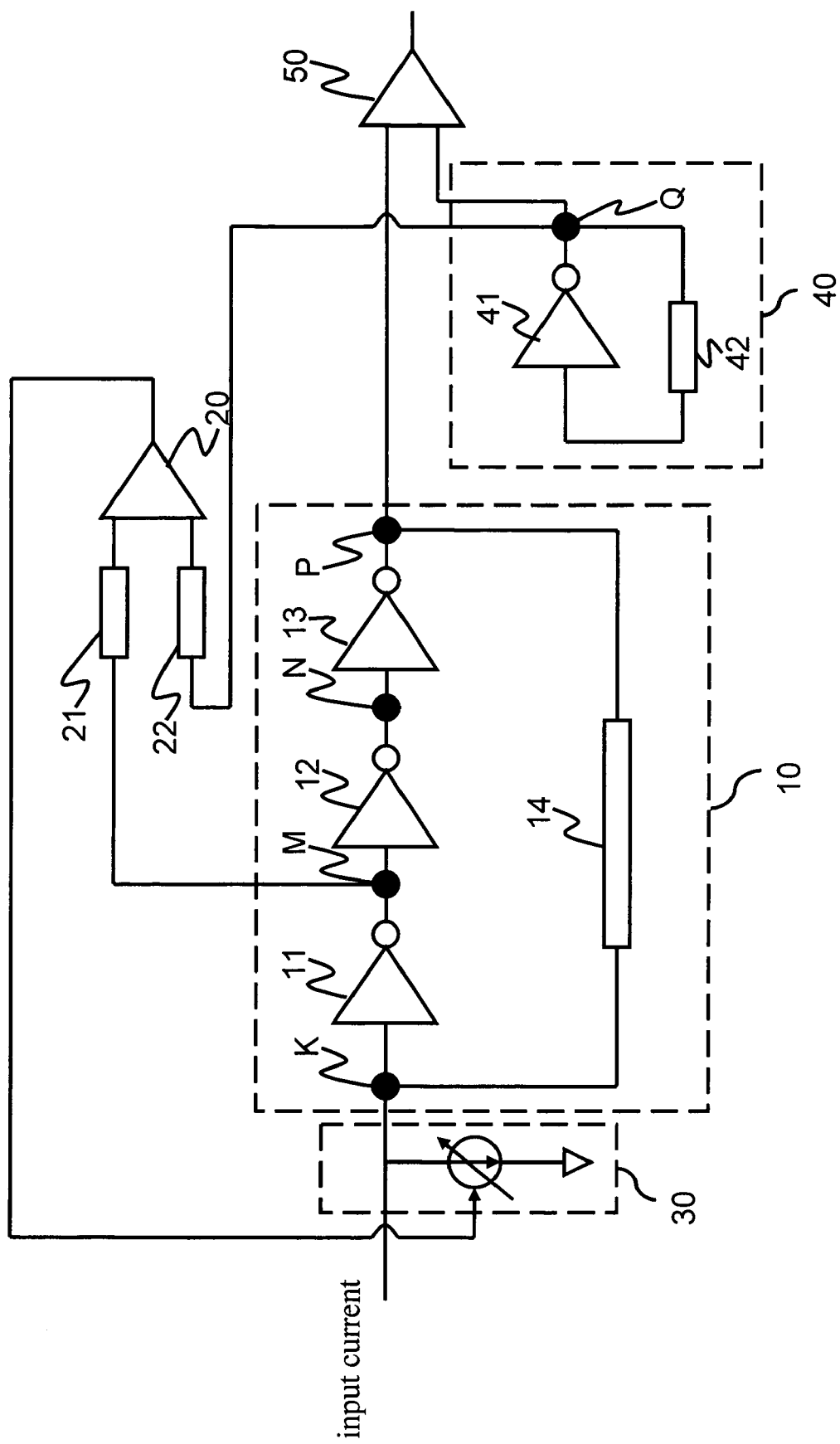
FIG. 2G is a circuit block diagram of a seventh embodiment of the present invention.

Referring to FIG. 2G, a circuit block diagram of a seventh embodiment of the present invention is shown, which is different from the first embodiment in that the sample nodes are different. The sample nodes retrieved by the seventh embodiment are sample nodes M and Q, and the circuit operating principle are as described above and will not be repeated herein.

Figure 2H:
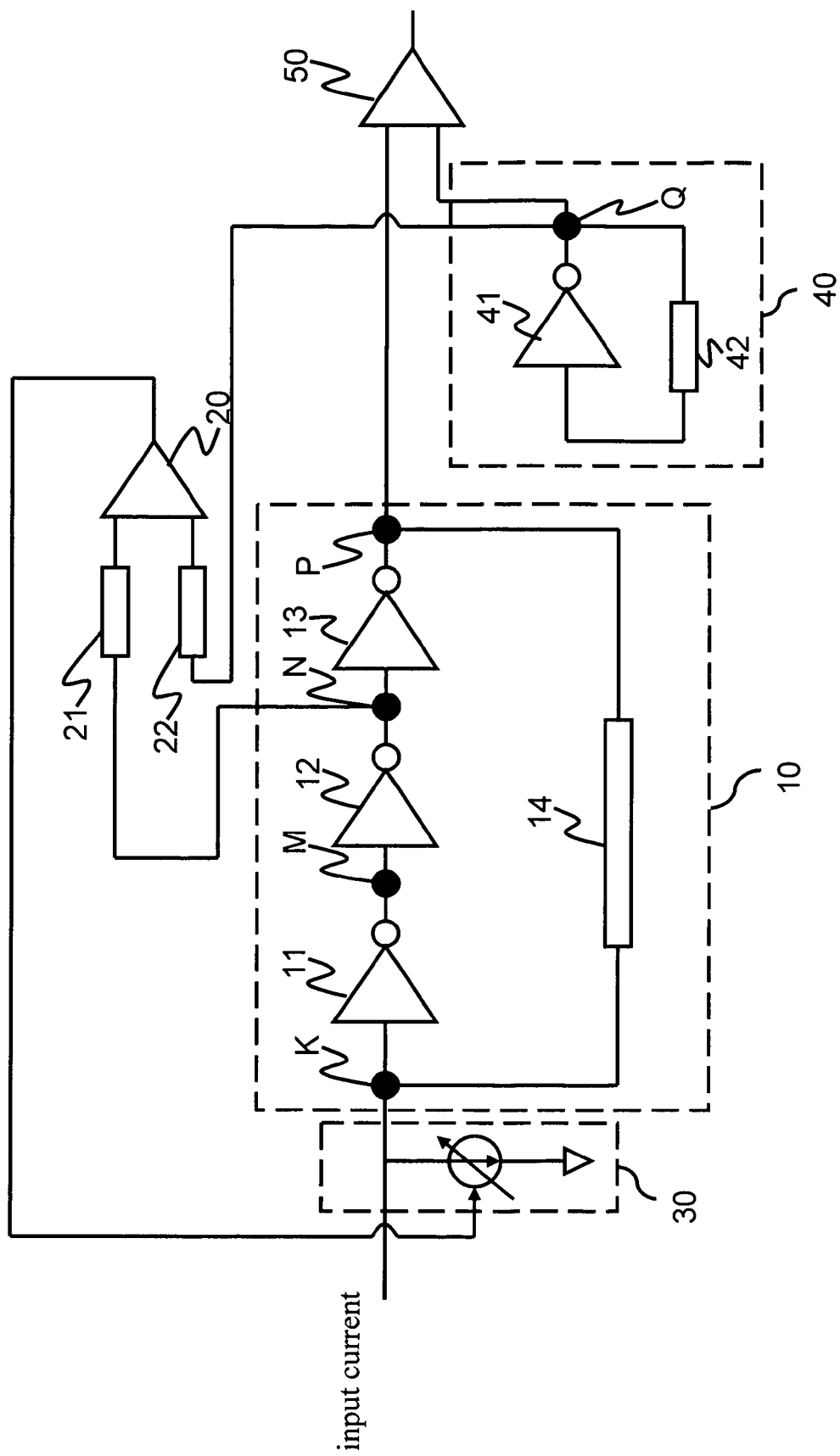
FIG. 2H is a circuit block diagram of an eighth embodiment of the present invention.

Referring to FIG. 2H, a circuit block diagram of a eighth embodiment of the present invention is shown, which is different from the first embodiment in that the sample nodes are different. The sample nodes retrieved by the eighth embodiment are sample nodes N and Q, and the circuit operating principle are as described above and will not be repeated herein.

Figure 2I:
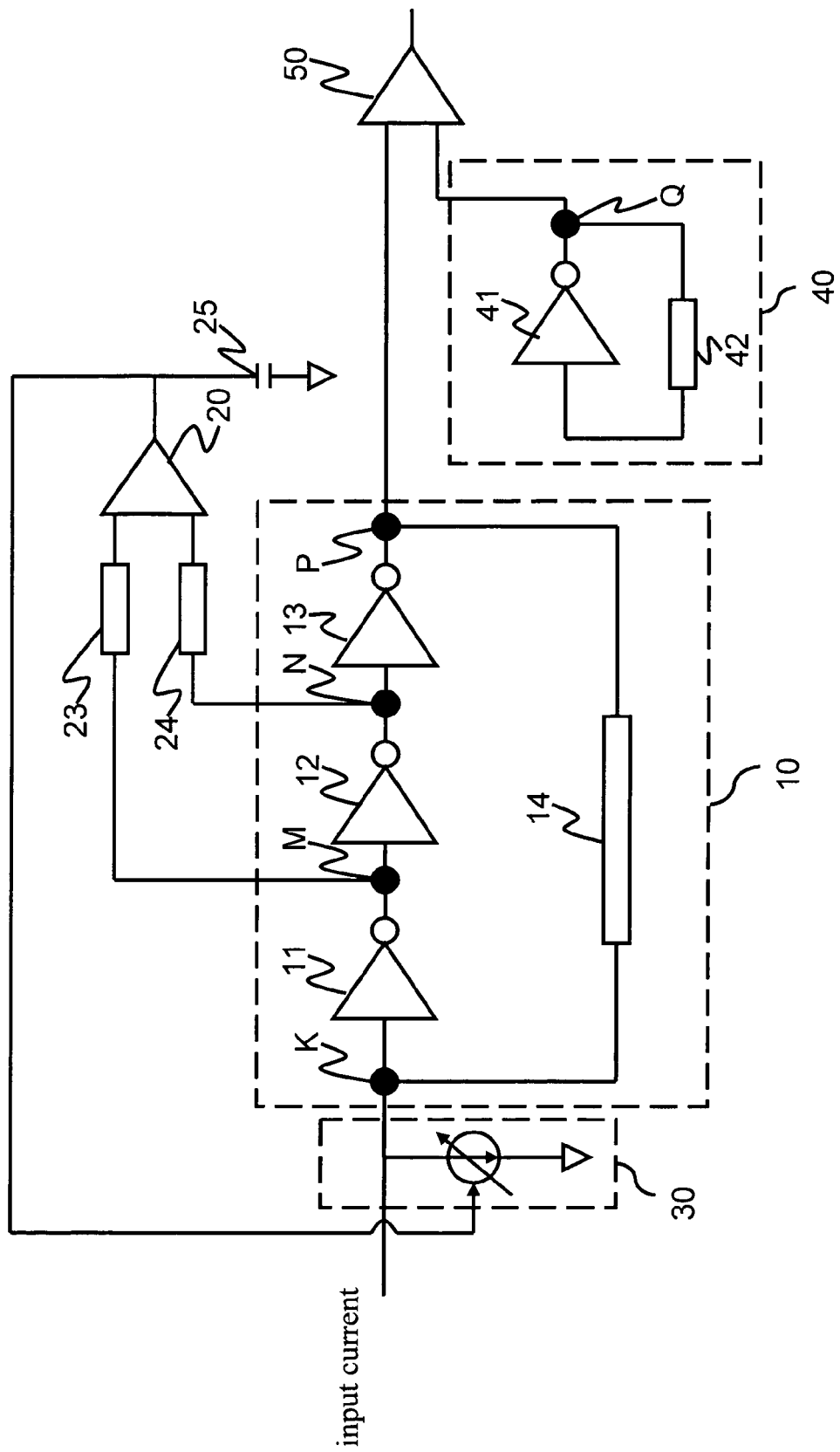
FIG. 2I is a circuit block diagram of a ninth embodiment of the present invention.

Referring to FIG. 2I, a circuit block diagram of a ninth embodiment of the present invention is shown, which is different from the first embodiment in that a resistor 23 is connected in series between the first input end of the DC detector 20 and the sample node M, and a resistor 24 is connected in series between the second input end and the sample node N, with its output end connecting a capacitor 25 to the ground, and the circuit operating principle are as described above and will not be repeated herein.

Figure 2J:
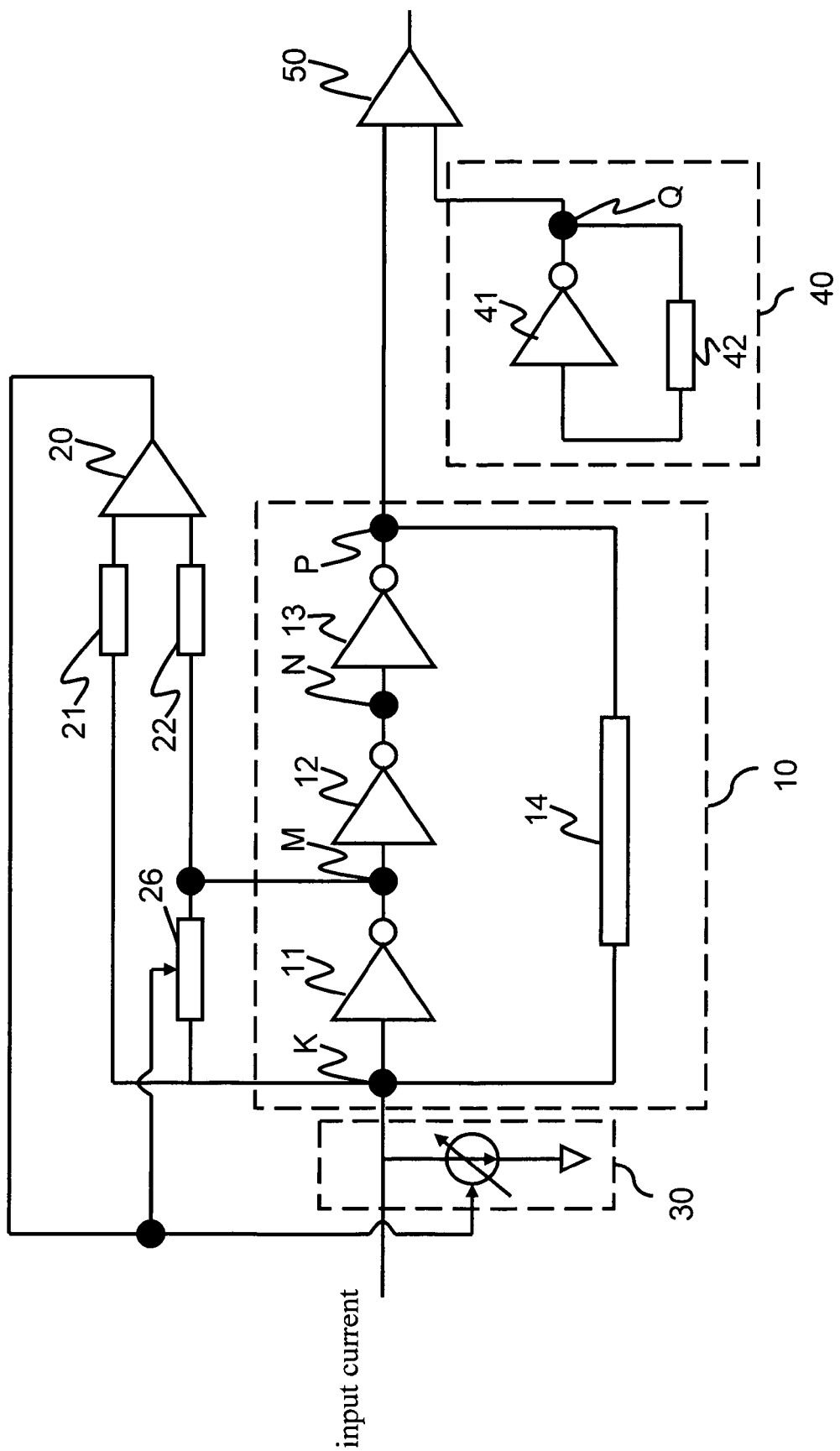
FIG. 2J is a circuit block diagram of a tenth embodiment of the present invention.

Referring to FIG. 2J, a circuit block diagram of a tenth embodiment of the present invention is shown, which includes a trans-impedance amplifier 10, a DC detector 20, a DC eliminator 30, a reference voltage unit 40, a voltage amplifier 50 and a gain controller 26.

The trans-impedance amplifier 10 has an input end and an output end, wherein the input end is used for receiving an input current, and converting the input current into a first voltage signal to be output by the output end. The trans-impedance amplifier 10 further includes a first inverter 11, a second inverter 12, a third inverter 13 and a resistor 14. Each inverter is connected separately in series, and a sample node is defined between each inverter and at the input and output ends of the trans-impedance amplifier 10 respectively (i.e. sample node K, M, N and P). And the resistor 14 has one end connected to the input end of the trans-impedance amplifier 10, and the other end connected to the output end of the trans-impedance amplifier 10. The said inverters can be composed of PMOS and NMOS transistors, and the width ratio of PMOS and NMOS of each inverter is the same.

The DC detector 20 has a first input end and a second input end connected respectively to the sample node K and the sample node M, for retrieving and comparing the signals at the sample node K and the sample node M, thereby generating a trigger signal and output it to the DC eliminator 30 through the output end. A low pass filter 21 is connected in series between the first input end and the sample node K, and a low pass filter 22 is connected in series between the second input end and the sample node M, wherein the DC detector 20 can be composed of a comparison operational amplifier.

Furthermore, the low pass filter 21 and the low pass filter 22 connected in series to the first input end and the second input end of the DC detector 20 may be displaced by a resistor 23 and a resistor 24, and a capacitor 25 is connected to the ground at the output end of the DC detector 20 (as shown in the ninth embodiment).

The DC eliminator 30 is connected to the input end of the trans-impedance amplifier 10, and is triggered by the trigger signal, for providing a path to the DC component of the input current, to eliminate the DC component of the input current, wherein the DC eliminator 30 can be composed of a variable current source.

The reference voltage unit 40 used for outputting a reference voltage value is composed of a trans-impedance amplifier circuit architecture, which includes a forth inverter 41 and a resistor 42. A sample node Q is defined at the output end of the forth inverter 41, and both ends of the resistor 42 are connected respectively to the input and output ends of the forth inverter 41, wherein the width ratio of PMOS and NMOS of the forth inverter 41 is the same as the width ratio of PMOS and NMOS of the first inverter 11, the second inverter 12 and the third inverter 13 in the trans-impedance amplifier 10.

The voltage output amplifier 50 has a first input end connected to the sample node Q and a second input connected to the sample node P, for comparing the reference voltage and the first voltage signals, to amplify the output of a second voltage signal, wherein the voltage output amplifier 50 can be composed of a comparison operational amplifier.

The gain controller 26 is connected in parallel to the input and output ends of the first inverter 11 in the trans-impedance amplifier 10 for receiving a feedback trigger signal to control the gain of the trans-impedance amplifier 10, wherein the gain controller 26 can be composed of PMOS or NMOS.

The circuit operation principle will be described herein below. First, when there is no input signal, the DC levels of the sample nodes M, N, P in the trans-impedance amplifier 10 and the sample node Q in the reference voltage unit 40 are the same; and when there is an input signal, the DC levels of the sample nodes M, N and P start to change, and the DC offset amount in the input signal can thus be obtained through comparing the sample nodes M and K. Next, the DC detector 20 outputs the DC offset amount and feeds back to the DC eliminator 30, to provide a path to the DC component of the input signal, and thereby to eliminate the DC component of the input signal.

When the input signal is excessively large, the DC detector 20 will output the DC offset amount and feedback to the gain controller 26, while the gain controller 26 will adjust the output gain value of the trans-impedance amplifier 10, to further control the output value of the voltage output amplifier 50.

Furthermore, the sample nodes can be collocated randomly, but two sample nodes at the input and output ends of the trans-impedance amplifier 10 (i.e. sample node K and sample node P) will not be taken at the same time; and when the sample node is Q, the output end of the trans-impedance amplifier 10 (i.e. sample node P) will not be taken.

Figure 2K:
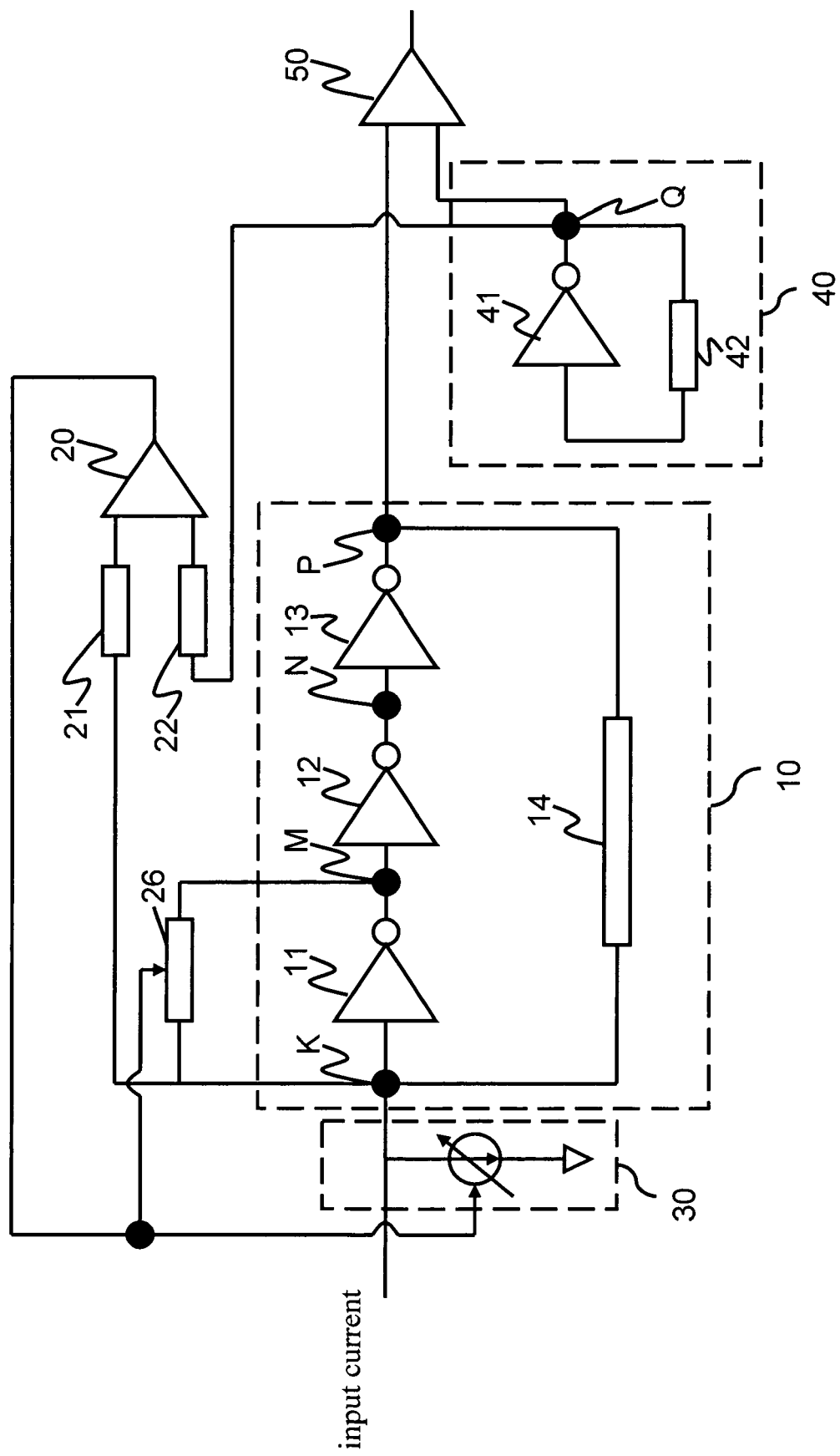
FIG. 2K is a circuit block diagram of an eleventh embodiment of the present invention.

Referring to FIG. 2K, a circuit block diagram of an eleventh embodiment of the present invention is shown. The sample nodes may be collocated randomly as shown in the tenth embodiment, but different from the tenth embodiment in that the sample nodes are taken at the K point and Q point, and the circuit operation principle is the same as that of the tenth embodiment, and will not be repeated herein.

With such DC offset canceling circuit of trans-impedance amplifier and the automatic gain control trans-impedance amplifier thereof, the DC offset amount is obtained more precisely through the property of the inverter in the trans-impedance amplifier, to eliminate the DC component in the input current, and the automatic gain control mechanism can control the output of the trans-impedance amplifier more efficiently, to prevent the influence to the next circuit operation when the input signal is excessively large.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A direct current (DC) offset canceling circuit of trans-impedance amplifier used for filtering a DC component of an input current, comprising:
a trans-impedance amplifier having an input end and an output end, wherein the input end is used for receiving the input current, and converting the input current into a first voltage signal to be output by the output end, said trans-impedance amplifier comprising:
a plurality of inverters connected in series, wherein a sample node is defined between the inverters and at the input and output ends of the trans-impedance amplifier respectively; and
a resistor having one end connected to the input end, and the other end connected to the output end;
a DC detector for retrieving and comparing the signals at any sample node, thereby generating a trigger signal;
a DC eliminator connected to the input end of the trans-impedance amplifier, for providing a path to the DC component of the input current in response to the triggering by the trigger signal, to eliminate the DC component;
a reference voltage unit for outputting a reference voltage value; and
a voltage output amplifier for comparing the reference voltage and the first voltage signals, to amplify the output of a second voltage signal.

2. The DC offset canceling circuit as claimed in claim 1, wherein the inverters comprise odd numbers of inverters.

3. The DC offset canceling circuit as claimed in claim 2, wherein the inverters are three.

4. The DC offset canceling circuit as claimed in claim 1, wherein the DC detector has two input ends and a single output end, and a low pass filter is further connected in series between each of the input ends and each of the sample nodes.

5. The DC offset canceling circuit as claimed in claim 1, wherein the DC detector has two input ends and a single output end, and a resistor is further connected in series between each of the input ends and each of the sample nodes of the DC detector.

6. The DC offset canceling circuit as claimed in claim 5, wherein the output end of the DC detector is connected to the ground through a capacitor.

7. The DC offset canceling circuit as claimed in claim 1, wherein the width ratio of PMOS and NMOS of each of the inverters is the same.

8. The DC offset canceling circuit as claimed in claim 7, wherein the reference voltage unit further comprises a inverter and a resistor, the resistor having one end connected to the input end of the inverter, and the other end connected to the output end of the inverter.

9. The DC offset canceling circuit as claimed in claim 8, wherein the width ratio of PMOS and NMOS of the inverter of the reference voltage unit is the same as the width ratio of PMOS and NMOS of each of the inverters in the trans-impedance amplifier.

10. The DC offset canceling circuit as claimed in claim 1, wherein the DC detector is further used for retrieving the reference voltage value of the reference voltage unit and comparing it to the signals at any of the sample nodes.

11. An automatic gain control trans-impedance amplifier, comprising:
a trans-impedance amplifier having an input end and an output end, wherein the input end is used for receiving the input current, and converting the input current into a first voltage signal to be output by the output end, the trans-impedance amplifier comprising:
a plurality of inverters connected in series, wherein a sample node is defined between the inverters and at the input and output ends of the trans-impedance amplifier, respectively; and
a resistor having one end connected to the input end, and the other end connected to the output end;
a DC detector for retrieving and comparing the signals at any sample node, thereby generating a trigger signal;
a DC eliminator connected to the input end of the trans-impedance amplifier, for providing a path to the DC component of the input current in response to the triggering by the signal trigger, to eliminate the DC component;
a reference voltage unit for outputting a reference voltage value;
a voltage output amplifier for comparing the reference voltage and the first voltage signal, to amplify the output of a second voltage signal; and
a gain controller connected in parallel to a first inverter in the trans-impedance amplifier, for receiving the feedback trigger signal, to control the gain of the trans-impedance amplifier.

12. The trans-impedance amplifier as claimed in claim 11, wherein the inverters comprise odd numbers of inverters.

13. The trans-impedance amplifier as claimed in claim 12, wherein the inverters are three.

14. The trans-impedance amplifier as claimed in claim 11, wherein the DC detector has two input ends and a single output end, and a low pass filter is further connected in series between each of the input ends and each of the sample nodes.

15. The trans-impedance amplifier as claimed in claim 11, wherein the DC detector has two input ends and a single output end, and a resistor is further connected in series between each of the input ends and each of the sample nodes of the DC detector.

16. The trans-impedance amplifier as claimed in claim 15, wherein the output end of the DC detector is connected to the ground through a capacitor.

17. The trans-impedance amplifier as claimed in claim 11, wherein the width ratio of PMOS and NMOS of each of the inverters is the same.

18. The trans-impedance amplifier as claimed in claim 17, wherein the reference voltage unit further comprises a inverter and a resistor, the resistor having one end connected to the input end of the inverter, and the other end connected to the output end of the inverter.

19. The trans-impedance amplifier as claimed in claim 18, wherein the width ratio of PMOS and NMOS of the inverter of the reference voltage unit is the same as the width ratio of PMOS and NMOS of each of the inverters in the trans-impedance amplifier.

20. The trans-impedance amplifier as claimed in claim 11, wherein the DC detector is further used for retrieving the reference voltage value of the reference voltage unit and comparing it to the signals at any of the sample nodes.

* * * * *